(12) United States Patent
Kull et al.

(10) Patent No.: US 9,520,891 B1
(45) Date of Patent: Dec. 13, 2016

(54) SUCCESSIVE APPROXIMATION REGISTER CONVERTER

(71) Applicant: International Business Machines Corporation, Armonk, NY (US)

(72) Inventors: Lukas Kull, Thalwil (CH); Danny Chen-Hsien Luu, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/943,411

(22) Filed: Nov. 17, 2015

(51) Int. Cl.
H03M 1/38 (2006.01)
H03M 1/46 (2006.01)
H03M 1/12 (2006.01)

(52) U.S. Cl.
CPC ............. *H03M 1/462* (2013.01); *H03M 1/124* (2013.01)

(58) Field of Classification Search
CPC .......... H03M 1/38; H03M 1/08; H03M 1/123; H03M 1/164; H03M 1/466; H03M 1/468; H03M 1/462; H03M 1/144; H03M 1/804; H03M 1/1215; H03M 1/1061; H03M 1/0692; H03M 1/1295; H03M 1/0678; H03M 1/0682; H03M 1/124
USPC ................................................. 341/130–170
See application file for complete search history.

(56) References Cited

U.S. PATENT DOCUMENTS

| | | | |
|---|---|---|---|
| 6,958,722 B1 * | 10/2005 | Janakiraman | H03M 1/144 341/156 |
| 8,390,496 B2 | 3/2013 | Fayed et al. | |
| 8,570,206 B1 * | 10/2013 | Lin | H03M 1/144 341/160 |
| 8,570,261 B2 * | 10/2013 | Gu | G02F 1/133512 345/87 |
| 8,674,861 B2 | 3/2014 | Matsuno et al. | |
| 2008/0129573 A1 * | 6/2008 | Mueck | H03M 1/0682 341/163 |
| 2010/0156692 A1 * | 6/2010 | Jeon | H03M 1/164 341/162 |
| 2011/0133971 A1 * | 6/2011 | Ogawa | H03M 1/0678 341/155 |
| 2012/0133541 A1 * | 5/2012 | Schmatz | H03M 1/462 341/172 |

(Continued)

FOREIGN PATENT DOCUMENTS

| | | |
|---|---|---|
| CN | 203554417 U | 4/2014 |
| WO | 20140133908 A1 | 4/2014 |

*Primary Examiner* — Lam T Mai
(74) *Attorney, Agent, or Firm* — Cantor Colburn LLP; Daniel Morris

(57) ABSTRACT

The present invention relates to a successive approximation register analog-to-digital converter (SAR ADC) for providing a digital approximation of a sampled differential input signal as a result of a successive approximation operation. The SAR ADC comprises a first comparison stage configured to perform a first set of decision steps of the successive approximation operation and a second comparison stage configured to perform a second set of decision steps of the successive approximation operation. Furthermore, the SAR ADC comprises a regulation circuit configured to adjust the common mode of the input signal towards a target common mode before the second comparison stage performs the second set of decision steps. The present invention further relates to a corresponding method and a corresponding design structure.

20 Claims, 8 Drawing Sheets

(56) References Cited

U.S. PATENT DOCUMENTS

| | | | |
|---|---|---|---|
| 2012/0133547 A1* | 5/2012 | Macdonald | G01S 13/931 342/70 |
| 2012/0154194 A1* | 6/2012 | Chang | H03M 1/002 341/158 |
| 2012/0280841 A1* | 11/2012 | Wang | H03M 1/1295 341/110 |
| 2013/0033392 A1* | 2/2013 | Nani | H03M 1/08 341/166 |
| 2013/0044014 A1* | 2/2013 | Lin | H03M 1/1061 341/110 |

\* cited by examiner

US 9,520,891 B1

SUCCESSIVE APPROXIMATION REGISTER CONVERTER

BACKGROUND

The present invention relates to analog-to-digital converters, and more specifically to successive approximation register (SAR) converters.

SAR converters for analog-to-digital conversion are well known in the art. In particular, SAR converters are frequently used since they provide a wide range of achievable resolution and conversion time and have competitive power efficiency. Furthermore, SAR converters can be implemented by utilizing the advantages of the CMOS technology, which are small-sized switches and capacitors having well-defined relative capacitances.

BRIEF SUMMARY

According to a first aspect, the present invention is embodied as a successive approximation register analog-to-digital converter (SAR ADC) for providing a digital approximation of a sampled differential input signal as a result of a successive approximation operation. The SAR ADC comprises a first comparison stage configured to perform a first set of decision steps of the successive approximation operation and a second comparison stage configured to perform a second set of decision steps of the successive approximation operation. Furthermore, the SAR ADC comprises a regulation circuit configured to adjust the common mode of the input signal towards a target common mode before the second comparison stage performs the second set of decision steps.

According to another aspect, the invention can be embodied as a method for performing an analog-to-digital conversion by means of a successive approximation register analog-to-digital converter (SAR ADC). The method comprises performing, by a first comparison stage, a first set of decision steps. The method comprises adjusting, by a regulation circuit, a common mode of the input signal towards a target common mode. In addition, the method comprises performing, by a second comparison stage, a second set of decision steps. The adjusting of the common mode is executed before performing the second set of decision steps.

According to another aspect, the invention can be embodied as a design structure tangibly embodied in a machine readable medium for designing, manufacturing, or testing an integrated circuit. The design structure comprises a successive approximation analog-to-digital converter (SAR ADC) configured to provide a digital approximation of a sampled input signal as a result of a successive approximation operation. The SAR ADC comprises a first comparison stage configured to perform a first set of decision steps of the successive approximation operation and a second comparison stage configured to perform a second set of decision steps of the successive approximation operation. Furthermore, the SAR ADC comprises a regulation circuit configured to adjust a common mode of the input signal towards a target common mode before the second comparison stage performs the second set of decision steps.

Devices and methods embodying the present invention will now be described, by way of non-limiting examples, and in reference to the accompanying drawings. Technical features depicted in the drawings are not necessarily to scale. Also some parts may be depicted as being not in contact to ease the understanding of the drawings, whereas they may very well be meant to be in contact, in operation.

DETAILED DESCRIPTION

In reference to FIGS. 1-8, some general aspects and terms of embodiments of the invention are described. Embodiments of the invention concern an asynchronously clocked successive approximation analog-to-digital converter (SAR ADC), and in particular a differential SAR ADC that converts differential input signals into a digital approximation. Embodiments of the invention further relate to a method for performing an analog-to-digital conversion by means of a SAR ADC and a design structure for designing, manufacturing, or testing an integrated circuit of a SAR ADC.

As common mode of the SAR ADC it is in particular understood the common mode voltage at the input of a first and a second comparison stage of the SAR ADC. The common mode voltage of the comparison stages influences the decision time, noise and precision of the comparators itself and therewith also of the whole SAR ADC.

Figure 1:
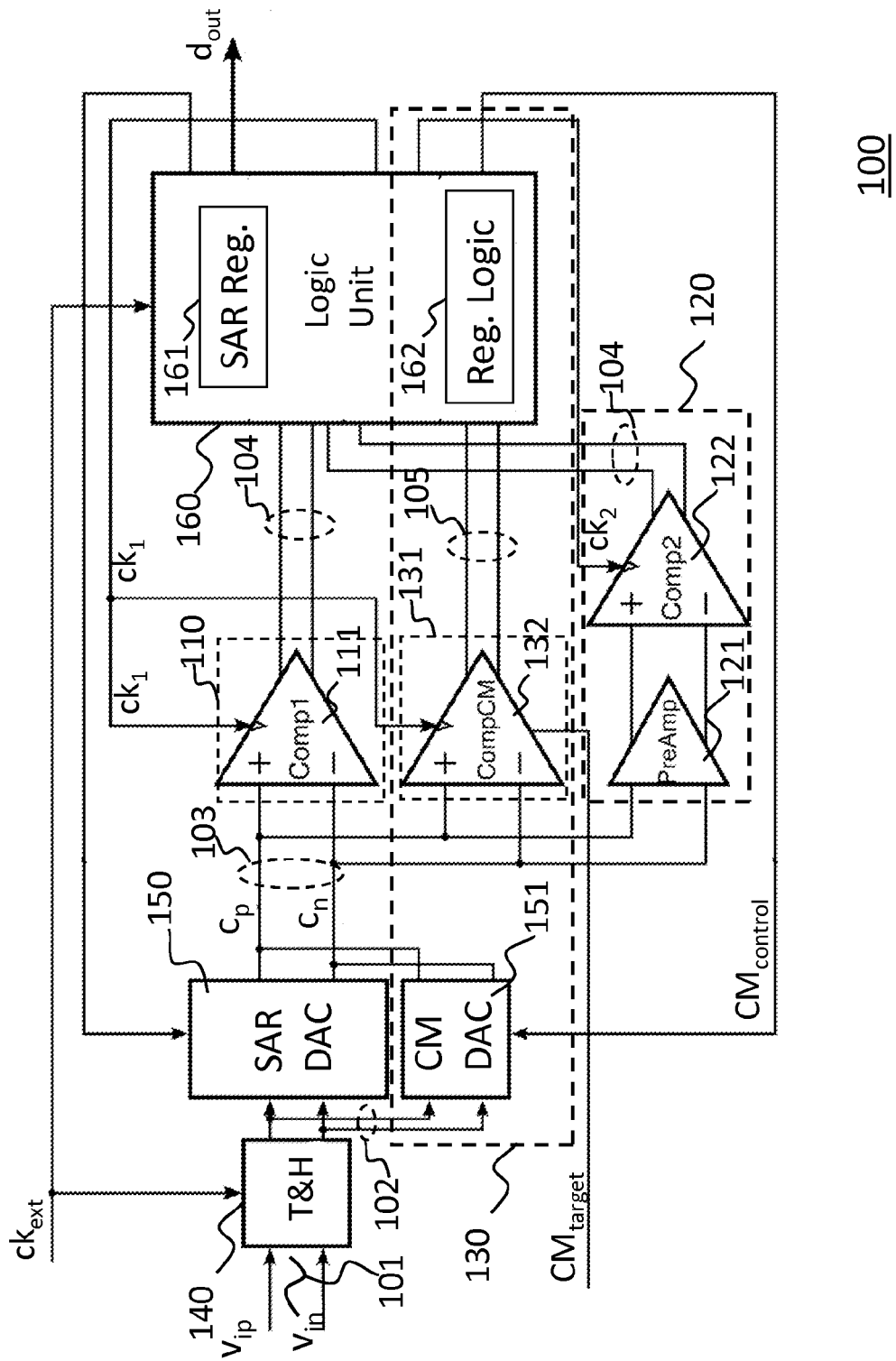
FIG. 1 is a block diagram of an asynchronously clocked successive approximation register analog-to-digital converter (SAR ADC) according to an embodiment of the invention.

FIG. 1 shows an exemplary embodiment of a SAR ADC 100. The SAR ADC 100 provides a digital approximation of an input signal 101 as a result of an asynchronous successive approximation operation. The SAR ADC 100 is embodied as a differential SAR ADC. Accordingly the input signal 101 is a differential input signal comprising a positive input voltage $v_{ip}$ and a negative input voltage $v_{in}$. The SAR ADC 100 is furthermore embodied as a single stage SAR ADC.

The SAR ADC 100 comprises a first comparison stage 110 configured to perform a first set of decision steps of the successive approximation operation. The SAR ADC 100 furthermore comprises a second comparison stage 120 configured to perform a second set of decision steps of the successive approximation operation. The SAR ADC 100 comprises furthermore a regulation circuit 130 configured to adjust the common mode of the input signal 101 towards a target common mode before the second comparison stage 120 performs the second set of decision steps.

The first comparison stage 110 may comprise one or more first stage comparators 111. The second comparison stage 120 comprises a preamplifier 121 followed by a second stage comparator 122. According to one embodiment the second comparison stage 120 may consist of only one preamplifier 121 followed by one second stage comparator 122. According to other embodiments the second comparison stage 120 may comprise a plurality of pairs, each pair comprising a preamplifier 121 followed by a second stage comparator 122 According to another embodiment the second comparison stage comprises one preamplifier shared by multiple comparators.

The regulation circuit 130 comprises a common mode comparison unit 131 comprising one or more common mode comparators 132. The common mode comparison unit 131 is configured to compare the common mode of the input signal 101 with the target common mode. Accordingly a target common mode signal $CM_{tar}$ is supplied to the common mode comparison unit 131. The common mode comparison unit 131 is configured to operate as clocked comparison unit.

The SAR ADC 100 further comprises a sampling circuit 140, also denoted as track & hold (T&H) unit. In addition, the SAR ADC 100 comprises a SAR digital-to analog-converter (SAR DAC) 150 and a common mode digital-to analog-converter (CM DAC) 151. The SAR DAC 150 and the CM DAC 151 may be preferably embodied as capacitive DACs comprising switchable capacitor banks on each of its input signal lines. Furthermore, the SAR ADC 100 comprises a logic unit 160. The logic unit 160 of the SAR ADC 100 is adapted to fulfill a plurality of control and logic function for the operation of the SAR ADC 100 as will be described below in more detail.

The input of the sampling circuit 140 is adapted to receive the input signal 101. The sampling circuit 140 provides as output signal a sample of the input signal 101, also denoted as sampled input signal 102. The output of the sampling circuit 140 is coupled to the input of the SAR DAC 150 and the input of the CM DAC 151. The output of the SAR DAC 150 and the CM DAC 151 is coupled to the input of the first comparison stage 110, the input of the second comparison stage 120 and the input of the common mode comparison unit 131. The output of the first comparison stage 110, the output of the second comparison stage 120 and the output of the common mode comparison unit 131 is coupled to an input of the logic unit 160. Output lines of the logic unit 160 are coupled to the SAR DAC 150, to the CM DAC 151, to the first comparison stage 110, to the second comparison stage 120 and to the common mode comparison unit 131. Furthermore, the logic unit 160 comprises output lines for providing a digital output signal $d_{out}$ as a result of the successive approximation.

The logic unit 160 and the sampling circuit 140 are coupled to an external clock generator and receive an external clock signal $ck_{ext}$ from the external clock generator. The external clock signal $ck_{ext}$ is periodic and has a fixed interval time. It may be provided in particular by an external clock generator that provides the clock for a system or circuit in which the SAR ADC 100 may be embedded. This may be in particular a system which uses and further processes the digital data $d_{out}$ provided by the SAR ADC 100. The clock cycle time of the external clock signal $ck_{ext}$ may define a predefined conversion time in which the SAR ADC 100 is expected to perform on average a conversion cycle. The external circuit in which the SAR ADC 100 may be embedded is then designed or can be designed for this predefined conversion time. According to other embodiments, the predefined conversion time may be set to a fraction of the clock cycle time of the external clock signal $ck_{ext}$, e.g. to half of the external clock cycle time.

In this example the SAR ADC 100 is embodied as an asynchronous ADC and the logic unit 160 comprises an asynchronous state machine. In other words, the conversion time for performing a successive approximation operation is not fixed and varies over time. Asynchronous ADCs may provide the advantage of shorter overall conversion time by removing waiting times during operation. According to other embodiments the SAR ADC may be embodied as synchronous ADC and accordingly the logic unit 160 may comprise a synchronous state machine.

The logic unit 160 comprises memory to store the outputs of the first comparison stage 110, of the second comparison stage 120 and of the common mode comparison unit 131. The logic unit 160 comprises a counter to count the number of decisions of the first comparison stage 110 and of the second comparison stage 120 in order to know the current bit position of the conversion and to address the memory. The logic unit 160 comprises furthermore a successive approximation register 161 for successively supplying an approximate digital code of the input signal 101 to the SAR DAC 150.

The logic unit 160 of the SAR ADC 100 comprises furthermore de-multiplexers for de-multiplexing the signals received from the first comparison stage 110, from the second comparison stage 120 and from the common mode comparison unit 131. In addition, the logic unit 160 of the SAR ADC 100 comprises a clock generation unit for generating an internal clock signal $ck_1$ and an internal clock signal $ck_2$. The internal clock signal $ck_1$ is provided for clocking the first comparison stage 110 and the common mode comparison unit 131. The internal clock signal $ck_2$ is provided for clocking the second comparison stage 120. The total cycle time of the internal clock signals $ck_1$ and $ck_2$ is not fixed and corresponds to the actual time that a conversion cycle needs for converting the sampled input signal 101 into a digital approximation. According to another embodiment the common mode comparison unit 131 may be clocked independently from the first comparison stage 110 and may hence receive its own independent clock signal $ck_3$ (not shown).

Furthermore, the logic unit 160 comprises a state machine, e.g. an asynchronous logic state machine and various other circuitry for providing the functions as below and above.

The logic unit 160 is configured to successively apply, by means of the SAR register 161, an approximate digital code of the sampled input signal 102 to the SAR DAC 150. The SAR DAC 150 provides then the difference between a digital approximation of the sampled input signal 102 based on the approximate digital code and the sampled input signal 102 itself as comparator signal 103 to the first comparison stage 110, the second comparison stage 120 and the common mode comparison unit 131.

In the following the function of the SAR ADC 100 will be explained in more detail.

In operation, the SAR ADC 100 receives the differential input signal 101 and forwards it to the sampling circuit 140. As mentioned, the sampling circuit 140 is directly controlled by the external clock signal $ck_{ext}$. The sampling circuit 140 samples the differential input signal 101 and provides a sample of the input signal 101 as sampled input signal 102 to the SAR DAC 150 and the CM DAC 151. The sampled input signal 102 is kept constant during a conversion cycle of the SAR ADC 100. Based on the digital code received from the SAR register 161, the SAR DAC 150 provides a digital approximation of the sampled input signal 102 and puts corresponding charges on its output lines. As a result, the SAR DAC 150 forwards the difference between the digital approximation and the sampled input signal 102 as comparator signal 103 to the inputs of the first comparison stage 110, the second comparison stage 120 and the common mode comparison unit 131. The comparator signal 103 is a differential signal comprising a positive comparator signal $c_p$ and a negative comparator signal $c_n$. The first comparison stage 110, the second comparison stage 120 and the common mode comparison unit 131 have an inverting and a non-inverting input, denoted with "−" and "+" respectively. The first comparison stage 110 and the second comparison stage 120 perform a clocked comparison of the signal 103 and provide as output a signal 104 to the logic unit 160 that indicates whether the differential input voltage applied between the non-inverting input and the inverting input is positive or negative. The first comparison stage 110 and the second comparison stage 120 are configured for performing a plurality of decision steps and provide decision outputs to the logic unit 160. Finally the logic unit 160 outputs the digital output signal $d_{out}$. The digital output signal $d_{out}$ is a digital representation of the sampled signal 102.

The regulation circuit 130 comprises the CM DAC 151, the CM comparison unit 131 and parts of the logic unit 160. The regulation circuit 130 comprises in particular a regulation logic 162 that is implemented in the logic unit 160. The common mode comparison unit 131 is clocked by the clock signal $ck_1$ provided by the logic unit 160 and performs a clocked comparison of the comparator signal 103 with the signal $CM_{tar}$. The common mode comparators 132 provide an output signal 105 to the logic unit 160 that indicates whether the CM of the comparator signal 103 applied between the non-inverting input and the inverting input is higher or lower than the common mode target signal $CM_{tar}$. The regulation circuit 130, and more particularly the corresponding regulation logic 162, is then configured to successively apply a control signal $CM_{control}$ based on the difference between the common mode of the comparator signal 103 and the target common mode signal $CM_{tar}$ to the common mode digital-to-analog converter 151. The CM DAC 151 is configured to shift the common mode of the comparator signal 103 towards the target common mode $CM_{tar}$ in dependence on the control signal $CM_{control}$. The corresponding control loop may be in particular implemented in a binary or radix fashion with the radix being smaller than 2. The control loop of the regulation circuit 130 adjusts the common mode of the comparator signal 103 towards the target common mode $CM_{tar}$ before the second comparison stage 120 starts its operation and before it starts to perform the second set of decision steps of the approximation. Hence it can be ensured that the common mode of the comparator signal 103 at the input of the second comparison stage 120 is already within a predefined range of the common mode target when the second comparison stage 120 starts its operation.

It should be noted that for adjusting the common mode of the comparator signal 103, the CM DAC 151 increases or decreases the voltage of the positive comparator signal $c_p$ and the negative comparator signal $c_n$ in the same direction. In other words, if the common mode of the comparator signal 103 is below the target common mode, the potential of both $c_p$ and $c_n$ is increased towards the target common mode, e.g. by switching charging capacitors to put appropriate charges on the output lines of the CM DAC 151. And if the common mode of the comparator signal 103 is above the target common mode, the potential of both $c_p$ and $c_n$ is decreased towards the target common mode by removing appropriate charges from the output lines of the CM DAC 151. Hence the common mode regulation has no influence on the differential part of the comparator signal 103, but only influences the common mode of the comparator signal 103.

On the contrary, the SAR DAC 150 operates on the differential part of the comparator signal 103 and aims at regulating $c_p-c_n$ towards 0. Accordingly in the successive approximation steps the SAR DAC 150 either decreases the potential for $c_p$ while increasing the potential for $c_n$ or it increases the potential for $c_p$ while decreasing the potential for $c_n$. This can be done by removing charge from the line of $c_p$ and adding charge to the line of $c_n$ or vice versa. Hence the regulation of the common mode and the successive approximation operation may be operated independently from each other.

To enable such a switching scheme the SAR DAC 150 and the CM DAC 151 may comprise charging and discharging capacitors coupled to both of its output signal lines. However, the switching scheme is different for the SAR DAC 150 and the CM DAC 151. The SAR DAC 150 employs a differential switching scheme while the CM DAC 151 employs a common mode switching scheme.

According to embodiments, the SAR ADC 100 is configured to adjust the common mode of the input signal 101 for each sample of the input signal 101. This has the advantage that the common mode is always within the predefined range of the target common mode for each of the decisions of the second comparison stage 120. This enables relaxed requirements concerning the common mode sensitivity of the second comparison stage 120. Hence according to embodiments the second comparison stage 120 can be implemented as a stage that is more common mode sensitive than the first comparison stage 110. Furthermore, the noise of the second comparison stage 120 may be lower than the noise of the first comparison stage 110.

According to embodiments of the invention the regulation circuit is configured to adjust the common mode for each sample of input signals having a common mode that is not constant over time. In other words, the regulation circuit is configured to adjust the common mode during each conversion cycle also if the common mode of the sampled input signal varies over time and in particular varies from sample to sample. According to embodiments the regulation circuit is configured to provide a sufficient speed of the regulation loop that enables such a sample by sample adjustment of the common mode for input signals with varying common mode.

Preferably the regulation circuit 130 and the first comparison stage 110 are operated in parallel and accordingly the common mode of the input signal is shifted towards the target common mode in parallel to the execution of the first set of decision steps. Alternatively the regulation circuit 130 may start its operation of adjusting the common mode only after the first comparison stage 110 has finished the first set of decisions. According to such an embodiment the second comparison stage 120 starts its operation then after the regulation circuit 130 has adjusted the common mode in a sufficient manner. In other words, the operation of the first comparison stage 110, the operation of the regulation circuit 130 and the operation of the second comparison stage 120 are performed in a sequential manner.

Embodiments of the invention relate to high performance SAR ADCs, as may be e.g. used in 5G mobile base stations. Higher resolution ADCs (>10 ENOB) at high speed are hard to realize with pipelining with minimum input capacitance. By using pre-amplification in front of the comparator, the total noise budget may be kept low. Embodiments of the invention facilitate the use of such pre-amplification by providing a solution to control the input common-mode of a pre-amplifier with comparator.

Figure 2:
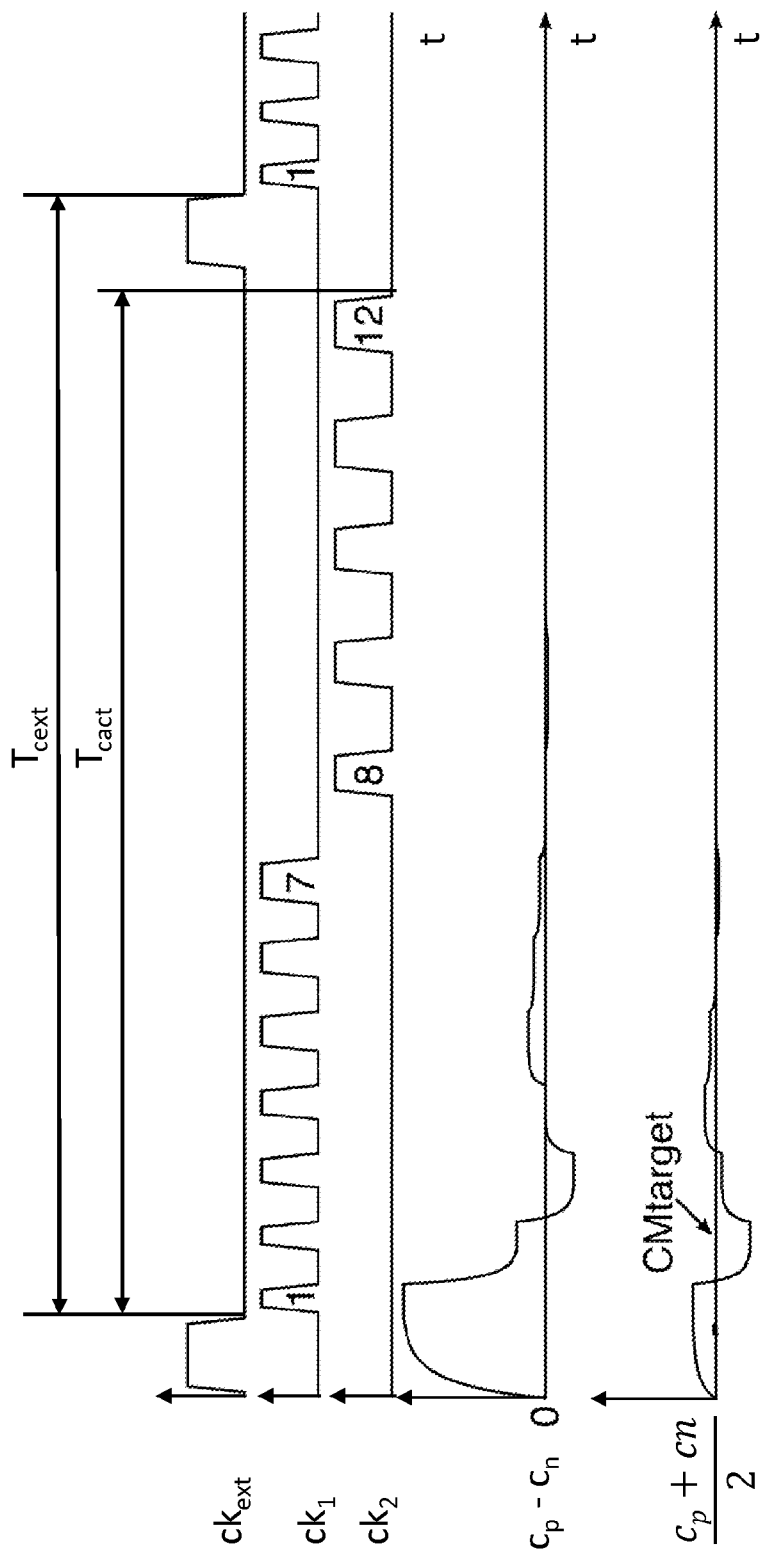
FIG. 2 illustrates exemplary timing diagrams of the SAR ADC of FIG. 1.

FIG. 2 shows an exemplary timing diagram of the SAR ADC 100 of FIG. 1. For the timing diagram of FIG. 2 it is assumed that the SAR ADC 100 is asynchronously clocked. FIG. 2 shows in total the timing of 5 different signals. The x-axis denotes the time t and the y-axis the amplitude of the respective signal in an exemplary and not to scale manner. The three signals in the top part illustrate the external clock signal $ck_{ext}$ provided by an external clock generator and the internal clock signals $ck_1$ and $ck_2$ provided by the logic unit 160. As illustrated, the actual conversion time $T_{cact}$ is not constant for each bit decision. The time required for a complete decision of the first comparison stage 110 and the second comparison stage 120 may depend e.g. on the input voltage at the input of the comparators of the first comparison stage 110 and the second comparison stage 120. Usually, the larger the input voltage difference, the faster the conversion. As the voltage difference for the Most Significant Bit MSBs is statistically larger than for the Least Significant Bit LSBs, the decision time for the MSBs is statistically shorter than for the LSBs. The conversion usually starts with the SAR DAC 150 set to midscale.

In the example of FIG. 2 the first comparison stage 110 performs 7 decision steps as first set of decision steps and in the following the second comparison stage 120 performs 5 decision steps as second set of decision steps. Accordingly the clock signal $ck_1$ comprises 7 pulses 1 to 7 followed by 5 pulses 8 to 12 of the clock signal $ck_2$. The falling clock edge of the external clock $ck_{ext}$ triggers the SAR logic and initiates the decision phase of the first comparison stage 110. The conversion time $T_{cact}$ ends with the falling edge of the pulse 12. In the example of FIG. 2 the actual conversion time $T_{cact}$ of the shown conversion of the SAR ADC is shorter than clock period $T_{cext}$ of the external clock signal $ck_{ext}$. At the end of the SAR conversion, the first comparison stage 110 and the second comparison stage 120 are reset to prevent inter-symbol interference (ISI) in the subsequent input sampling phase.

The lower part of FIG. 2 shows the timing diagram of the differential signal $c_p$-$c_n$ ($c_p$ minus $c_n$) of the comparator signal 103 at the input of the first comparison stage 110, the second comparison stage 120 and the common mode comparison unit 131. Furthermore, the timing diagram of the common mode $(c_p+c_n)/2$ of the comparator signal 103 is shown.

The SAR operation performed by the SAR DAC 150 regulates the differential signal $c_p$-$c_n$ towards 0. Accordingly, the crossing of the y-axis with the x-axis is at zero. As can be seen, the steps of the approximation are getting smaller and smaller over time. The operation of the regulation circuit 130 regulates the common mode $(c_p+c_n)/2$ of the signal comparator signal 103 towards the target common mode $CM_{tar}$. Accordingly, the crossing of the y-axis with the x-axis is at $CM_{tar}$ for the common mode signal $(c_p+c_n)/2$.

As can be seen, the regulation of the common mode signal $(c_p+c_n)/2$ is performed in parallel to the first set of decision steps 1-7 of the first comparison stage 110. Before the second comparison stage 120 performs the second set of decision steps 8-12, the common mode $(c_p+c_n)/2$ is already at the common mode target $CM_{tar}$ or within a predefined range of the common mode target $CM_{tar}$.

Figure 3:
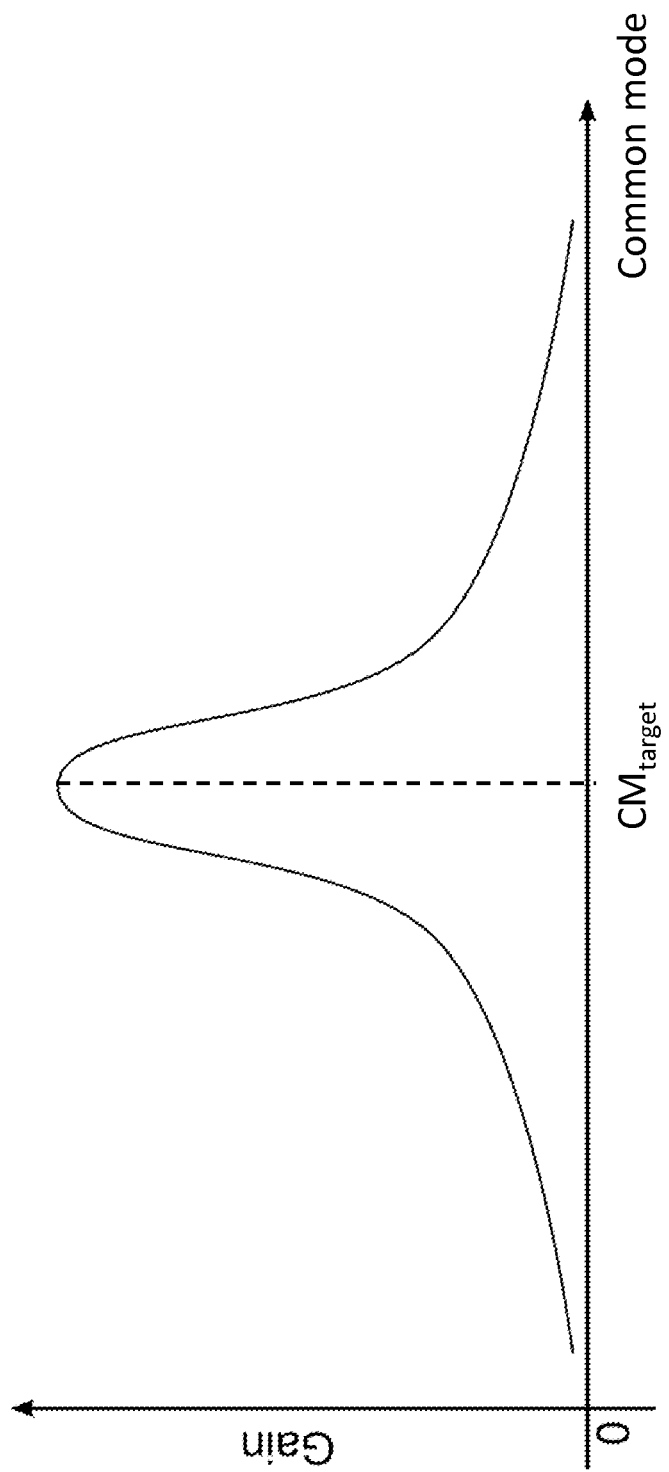
FIG. 3 shows a diagram of the gain of a preamplifier of a second comparison stage in dependence on the common mode.

FIG. 3 illustrates in an exemplary, simplified and schematic way how the gain of the preamplifier 121 according to embodiments of the invention depends on the common mode voltage at the input of the preamplifier 121. The x-axis denotes the input common mode voltage of the preamplifier 121 and the y-axis the gain of the preamplifier 121. As can be seen, the gain of the preamplifier 121 is highly dependent on the common mode of its input signal. The common mode target that is set for the regulation of the regulation circuit 130 and hence applied as $CM_{tar}$ signal to the common mode comparison unit 131 is preferably be chosen such that the preamplifier 121 has the highest gain.

Figure 4:
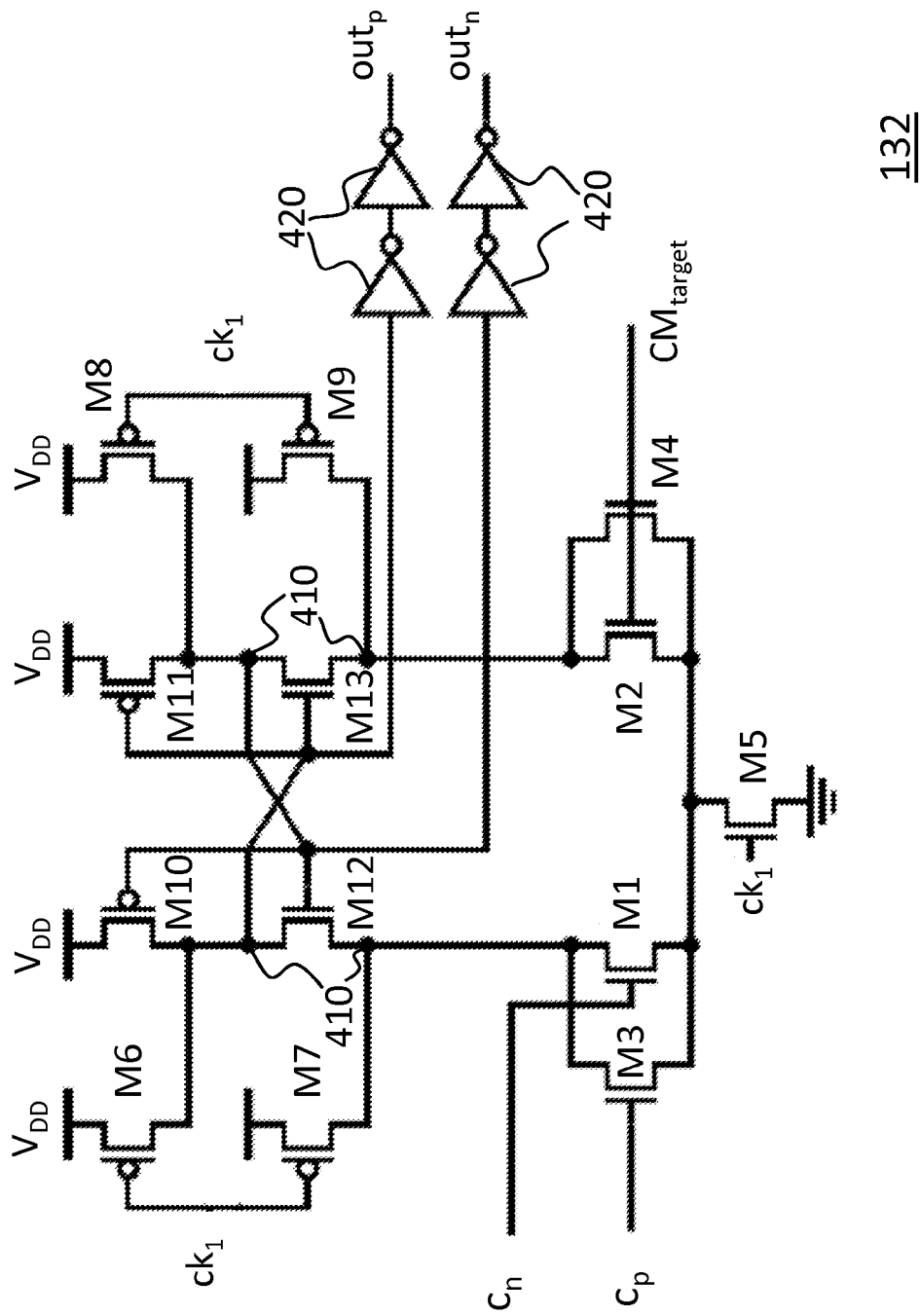
FIG. 4 shows an exemplary embodiment of common mode comparator according to an embodiment of the invention.

FIG. 4 shows an exemplary embodiment of an implementation of the common mode comparator 132 of the common mode comparison unit 131. Generally the embodiment of FIG. 4 is based on a standard sense amplifier latch, more particularly the Strong ARM latch topology. However, the input transistors have been modified to enable a comparison of the input common mode voltage with the target common mode voltage. Comparators based on the Strong ARM latch topology provide the advantage of a high conversion speed which is enabled by the single-stage design.

The common mode comparator 132 is a clocked comparator that is clocked by the internal clock signal $ck_1$ provided by the logic unit 160. The common mode comparator 132 of FIG. 4 comprises transistors M1, M2, M3, M4, M5, M6, M7, M8, M9, M10, M11, M13 and M13. The transistors M6, M7, M8 and M9 are p-MOSFETs that serve as pre-charging transistors. More particularly, they work as switches for loading the nodes 410 to the positive supply voltage $V_{DD}$ before the conversion. The gates of the transistors M6, M7, M8 and M9 are clocked by the internal clock signal $ck_1$ provided by the logic unit 160.

The transistors M10 and M11 are p-MOSFETs while the transistors M12 and M13 are n-MOSFETs. The transistors M10, M11, M12 and M13 form two inverters with positive feedback.

The transistors M1 and M3 are provided as input transistors, wherein the gate of the transistor M1 receives the negative comparator signal $c_n$ from the SAR DAC 150 and the CM DAC 151 respectively. The gate of the transistor M3 receives the positive comparator signal $c_p$ from the SAR DAC 150 and the CM DAC 151 respectively. The transistors M2 and M4 are provided as input transistors for the common mode target. The gates of both transistors M2 and M4 receive the common mode target signal $CM_{tar}$. The transistors M1, M2, M3 and M4 are implemented as n-MOSFETs.

The transistor M5 is also implemented as n-MOSFETs and works as current source. The gate of M5 is also clocked by the internal clock $ck_1$.

In operation, the common mode comparator 132 compares if $c_n+c_p$ is larger or smaller than 2 times the common mode target $CM_{tar}$. Therefore it compares the common mode $(c_n+c_p)/2$ of the input signal of the common mode comparator with the reference common mode $CM_{tar}$. This comparison is in particular accurate for small differences of $c_n$ and $c_p$. The CM comparator 132 forwards then via a double inverter gate 420 the decision of the comparison as output signals $out_p/out_n$ to the logic unit 160.

Figure 5:
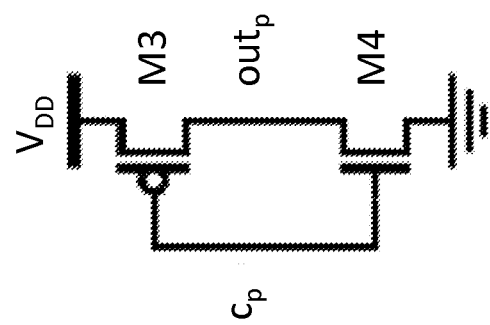
FIG. 5 shows an exemplary embodiment of an inverter based preamplifier according to an embodiment of the invention.
Figure 5:
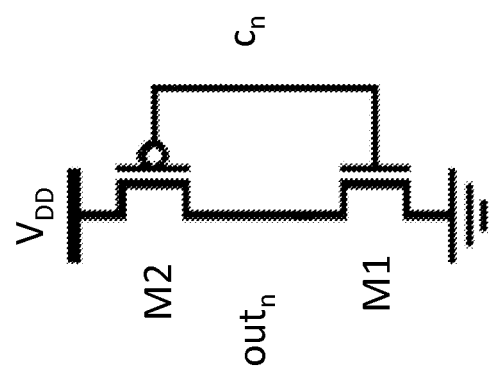

FIG. 5 shows an exemplary embodiment of an implementation of the preamplifier 121. The preamplifier 121 is in this example embodied as a pseudo-differential inverter. Such a preamplifier has a high gain and low input-referred low noise, but is very common mode sensitive. Due to the common mode regulation according to embodiments of the invention the use of such inverters as preamplifiers is facilitated.

The preamplifier 121 may be embodied as inverter or as an inverter-based preamplifier. In the exemplary embodiment of FIG. 5 the preamplifier 121 comprises on the left side an n-MOSFET transistor M1 and a p-MOSFET transistor M2 arranged in series between a supply voltage VDD and ground. The gates of M1 and M2 are connected. The gate receives the signal $c_n$ as input signal and an output signal out is provided between the drain of M1 and the source of M2. On the right side the preamplifier 121 comprises a p-MOSFET transistor M3 and an n-MOSFET transistor M4 arranged in series between the supply voltage VDD and ground. The gates of M3 and M4 are connected. The gates receive the signal $c_p$ as input signal and an output signal $out_p$ is provided between the drain of M3 and the source of M4.

Figure 6:
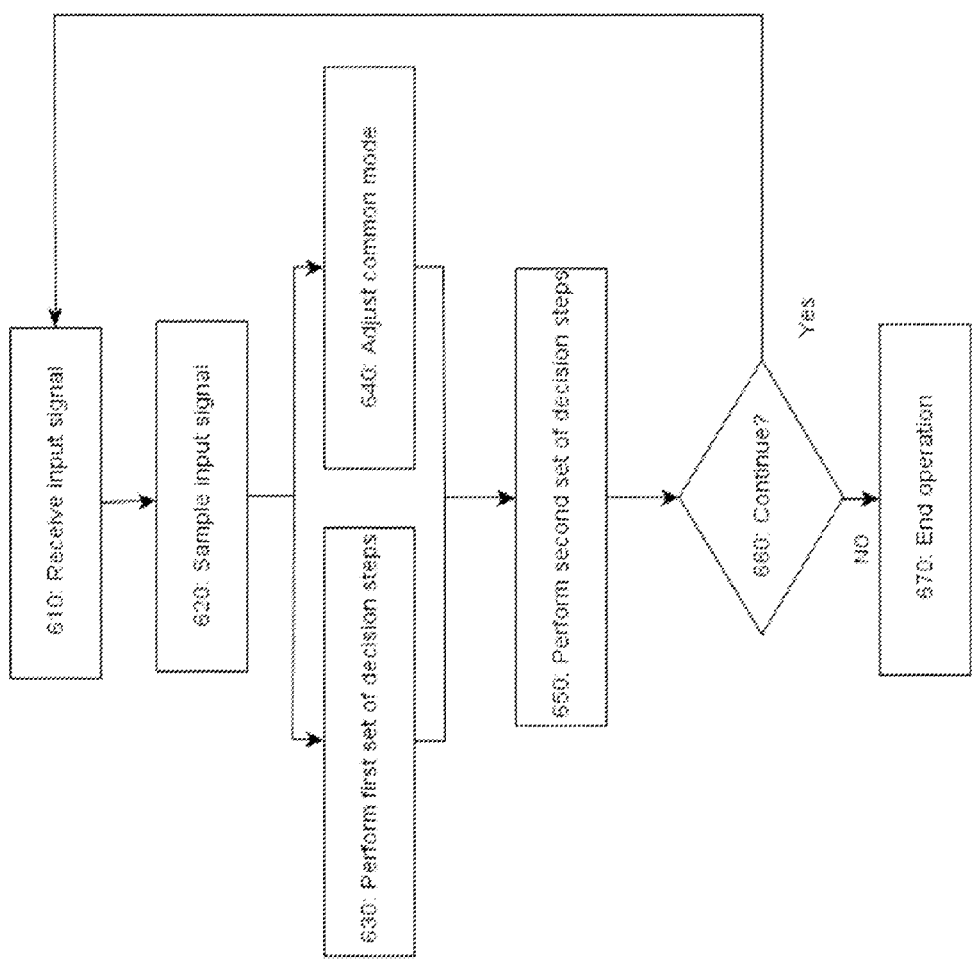
FIG. 6 shows a flow chart of a method according to an embodiment of the invention.

FIG. 6 shows a flowchart of a method for performing an analog-to-digital conversion by means of a successive approximation analog-to-digital converter (SAR ADC). As shown at block 610, a SAR ADC, e.g. the SAR ADC 100 according to FIG. 1, receives an input signal for which a digital approximation shall be provided by the SAR ADC. As shown at block 620, the input signal is sampled, e.g. by the sampling circuit 140 of FIG. 1.

As shown at block 630, a first comparison stage, e.g. the comparison stage 110 of FIG. 1, performs a first set of decision steps, e.g. the decision steps 1 to 7 as illustrated with reference to FIG. 1. The step 630 may include a sub-step of applying, by a successive approximation register (SAR), e.g. the SAR register 161 of FIG. 1, an approximate digital code of the sampled input signal to a SAR digital-to analog-converter (SAR DAC), e.g. the SAR DAC 150 of FIG. 1. In a further sub step the SAR DAC provides a digital approximation of the input signal and the SAR DAC forwards the difference between the digital approximation and the sampled input signal as comparator signal to the first and the second comparison stage.

As shown at block 640, a regulation circuit, e.g. the regulation circuit 130 of FIG. 1, adjusts the common mode of the input signal towards the target common mode. The block 640 is described in more detail with reference to FIG. 7. As shown at block 650, the second comparison stage performs a second set of decision steps. Block 650 may include a sub-step of applying, by the successive approximation register (SAR), an approximate digital code of the sampled input signal to the SAR digital-to analog-converter (SAR DAC). In a further sub step the SAR DAC provides a digital approximation of the input signal. In a further sub step the SAR DAC forwards the difference between the digital approximation and the sampled input signal as comparator signal to the first and the second comparison stage.

Generally adjusting of the common mode is executed before the block 650 of performing the second set of decision steps. However, adjusting of the common mode is can be executed in parallel to the block 630 of performing the first set of decision steps.

As shown at block 660, the SAR ADC checks whether it shall continue its operation. If yes, the method continues with block 610. Block 610 to 660 are repeated as a loop in an iterative manner. In particular, for each new sampled input signal the common mode is adjusted in block 640 before the second set of decision steps are performed in the block 650. If at block 660 it is concluded that the method shall not be continued, it is stopped at block 670.

Figure 7:
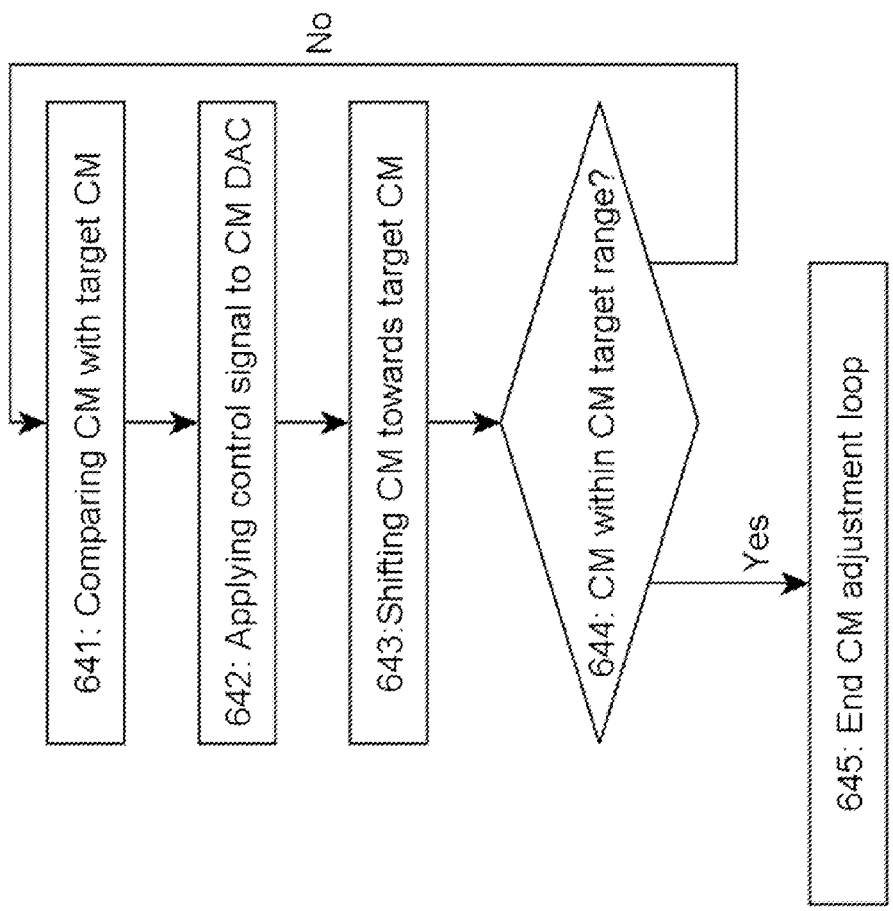
FIG. 7 illustrates a detailed flow chart of a method for regulating the common mode according to an embodiment of the invention.

FIG. 7 illustrates a flow chart of block 640 of the method of FIG. 6 in more detail. As shown at block 641, a common mode comparison unit, e.g. the common mode comparison unit 131 of FIG. 1, compares the common mode of the input signal with the target common mode. Based on the comparison, as shown at block 642, a control signal $CM_{control}$ is applied by the regulation logic 162 of the logic unit 160 to the common mode digital-to-analog converter 151 (CM DAC). The control signal is based on the difference between the actual common mode of the sampled input signal and the target common mode $CM_{tar}$. Then, as shown at block 643, the CM DAC shifts or adjusts respectively the common mode towards the target common mode in dependence on the control signal $CM_{control}$.

As shown at block 644 it is checked by the regulation logic 162 whether the actual common mode is within a predefined range of the common mode target $CM_{tar}$. If this is the case, the common mode regulation is ended at block 645 for the respective successive approximation operation. If this is not the case, the common mode regulation is continued with block 641. The corresponding control loop comprising blocks 641, 642, 643 and 644 may be in particular implemented in a binary or radix fashion with the radix being smaller than 2.

Figure 8:
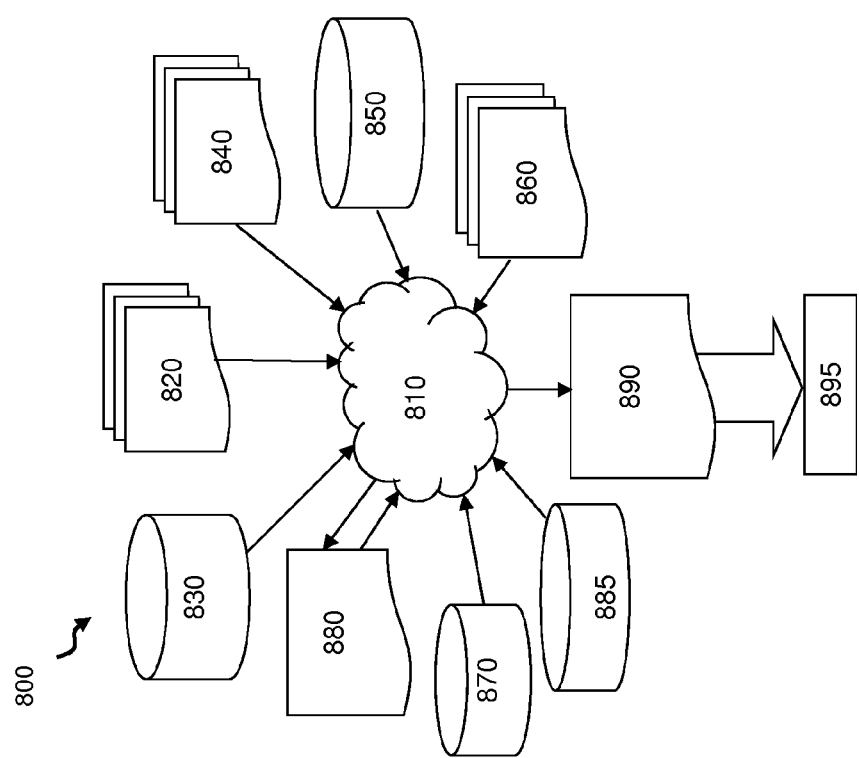
FIG. 8 is a flow diagram of a design process used in semiconductor design, manufacture, and/or test.

FIG. 8 shows a block diagram of an exemplary design flow 800 used for example, in semiconductor IC logic design, simulation, test, layout, and manufacture. Design flow 800 includes processes, machines and/or mechanisms for processing design structures or devices to generate logically or otherwise functionally equivalent representations of the design structures and/or devices described above and shown e.g. in FIGS. 1, 2, 5, 6, 7 and 8. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 1, 4 and 5. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 1, 4 and 5 to generate a Netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including Netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890.

Design structure 890 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 4 and 5. In one embodiment, design structure 890 may comprise a compiled, executable HDL simulation model that functionally simulates the devices shown in FIGS. 1, 4 and 5.

Design structure 890 may also employ a data format used for the exchange of layout data of integrated circuits and/or symbolic data format (e.g. information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 4 and 5. Design structure 890 may then proceed to a stage 895 where, for example, design structure 890 proceeds to tape-out, is released to manufacturing, is released to a mask house, is sent to another design house, is sent back to the customer, etc.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A successive approximation register analog-to-digital converter (SAR ADC) for providing a digital approximation of a sampled differential input signal as a result of a successive approximation operation, comprising:
   a first comparison stage configured to perform a first set of decision steps of the successive approximation operation;
   a second comparison stage configured to perform a second set of decision steps of the successive approximation operation; and a regulation circuit configured to adjust a common mode of a input signal towards a target common mode before the second comparison stage performs the second set of decision steps.

2. A converter according to claim 1, wherein the regulation circuit comprises a common mode comparison unit for comparing the common mode of the input signal with the target common mode.

3. A converter according to claim 2, wherein the common mode comparison unit is configured to operate as clocked comparison unit.

4. A converter according to claim 1, wherein the regulation circuit is configured to adjust the common mode of a sampled input signal for each sample of the input signal.

5. A converter according to claim 4, wherein the regulation circuit is configured to adjust the common mode for each sample of input signals having a common mode that is not constant over time.

6. A converter according to claim 1, wherein the first comparison stage is less common-mode sensitive than the second comparison stage.

7. A converter according to claim 1, wherein a noise of the second comparison stage is lower than the noise of the first comparison stage.

8. A converter according to claim 1, wherein the second comparison stage comprises a preamplifier followed by a second stage comparator.

9. A converter according to claim 8, wherein the preamplifier comprises an inverter or inverter-based amplifier.

10. A converter according to claim 1, wherein the regulation circuit and the first comparison stage are configured to adjust the common mode of the input signal towards the target common mode and to perform the first set of decision steps in parallel.

11. A converter according to claim 1, wherein the regulation circuit comprises:
a common mode digital-to analog-converter (CM DAC);
wherein the regulation circuit is configured to successively apply a control signal based on the difference between the common mode of a sampled input signal and the target common mode to the common mode digital-to-analog converter and wherein the CM DAC is configured to shift the common mode of the input signal towards the target common mode in dependence on the control signal.

12. A converter according to claim 1, comprising:
a sampling circuit configured to sample the input signal;
a successive approximation register (SAR);
a SAR digital-to analog-converter (SAR DAC);
wherein the SAR is configured to successively apply an approximate digital code of a sampled input signal to the SAR DAC and wherein the SAR DAC is configured to provide the difference between a digital approximation of the input signal and the sampled input signal as comparator signal to the first and the second comparison stage.

13. A converter according to claim 1, wherein the SAR ADC is a single stage SAR ADC.

14. A converter according to claim 1, wherein the SAR ADC is a synchronous SAR ADC.

15. A converter according to claim 1, wherein the SAR ADC is an asynchronous SAR ADC.

16. A method for performing an analog-to-digital conversion by means of a successive approximation register analog-to-digital converter (SAR ADC), the method comprising:
performing, by a first comparison stage, a first set of decision steps;
adjusting, by a regulation circuit, a common mode of a input signal towards a target common mode;
performing, by a second comparison stage, a second set of decision steps;
wherein the adjusting of the common mode is executed before the performing of the second set of decision steps.

17. A method according to claim 16, wherein the adjusting of the common mode is executed in parallel to the performing of the first set of decision steps.

18. A method according to claim 16, further comprising:
comparing, by a common mode comparison unit of the regulation circuit, the common mode of the input signal with the target common mode.

19. A method according to claim 16, further comprising:
successively applying, by the regulation circuit, a control signal based on the difference between the common mode of the sampled input signal and the target common mode to a common mode digital-to-analog converter (CM DAC); and
shifting, by the CM DAC, the common mode towards the target common mode in dependence on the control signal.

20. A design structure tangibly embodied in a machine readable medium for designing, manufacturing, or testing an integrated circuit, the design structure comprising:
a successive approximation analog-to-digital converter (SAR ADC) configured to provide a digital approximation of a sampled input signal as a result of a successive approximation operation, the SAR ADC comprising:
a first comparison stage configured to perform a first set of decision steps of the successive approximation operation;
a second comparison stage configured to perform a second set of decision steps of the successive approximation operation; and
a regulation circuit configured to adjust a common mode of a input signal towards a target common mode before the second comparison stage performs the second set of decision steps.

* * * * *